Figure 1:
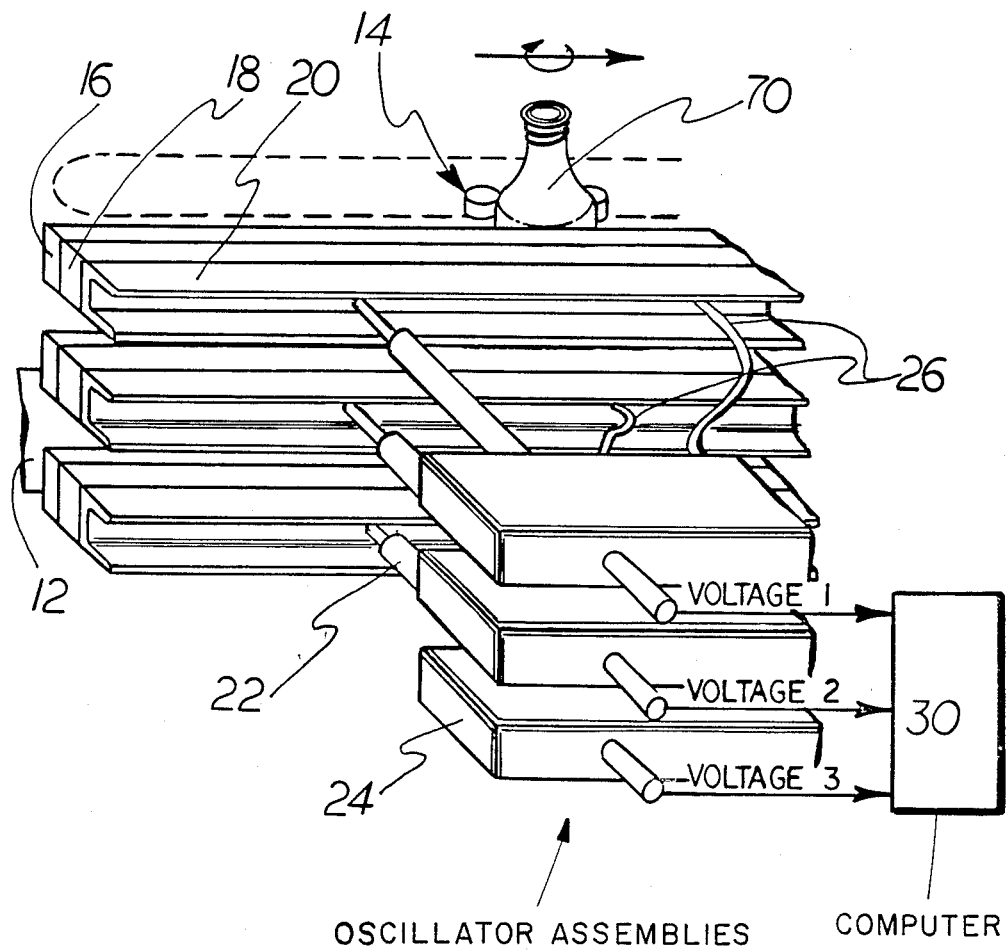

United States Patent [19]
Scott

[11] Patent Number: 4,870,342
[45] Date of Patent: Sep. 26, 1989

[54] GLASS CONTAINER WALL THICKNESS INSPECTING MACHINE

[75] Inventor: Paul F. Scott, Hartford, Conn.

[73] Assignee: Emhart Industries, Inc., Indianapolis, Ind.

[21] Appl. No.: 253,827

[22] Filed: Oct. 5, 1988

[51] Int. Cl.$^4$ .......................................... G01R 27/26
[52] U.S. Cl. .................................................. 324/61 R
[58] Field of Search ............... 324/61 R, 61 P; 209/82

[56] References Cited

U.S. PATENT DOCUMENTS

| | | | |
|---|---|---|---|
| 2,573,824 | 11/1951 | Baker | 324/61 R |
| 2,616,068 | 10/1952 | McDonald | 324/61 R |
| 3,684,089 | 8/1972 | McMeekin | 324/61 R |
| 4,658,254 | 4/1987 | Walton | 324/61 R |

Primary Examiner—Reinhard J. Eisenzopf
Assistant Examiner—Maura K. Regan
Attorney, Agent, or Firm—Carl A. Forest

[57] ABSTRACT

The capacitance of the wall of a glass bottle is sensed and converted to a periodic voltage by a measuring oscillator. A periodic voltage is generated by a phase locked loop which includes a voltage controlled reference oscillator which is forced to operate at the same frequency as the measuring oscillator. The voltage inputted to the reference oscillator will accordingly represent the thickness of the wall of the container. The following model is utilized by the machine computer to translate capacitance to thickness;

$$C(T) = A \times T/(1 + B \times T)$$

where C is the measured capacitance, T is the wall thickness, A is the coefficient describing the small thickness, linear relationship and B is the coefficient describing the large thickness, non-linear relationship.

1 Claim, 2 Drawing Sheets

OSCILLATOR ASSEMBLIES COMPUTER

GLASS CONTAINER WALL THICKNESS INSPECTING MACHINE

A bottle or container is formed from a gob of molten glass in an individual section glass container forming machine by first pressing or blowing the gob into a parison and then blowing the parison into the container. When glass is uniformly distributed in this process, wall thickness will be uniform, but when glass distribution is not uniform, thin spots can occur which may result in bottle failure during filling or handling.

The high dielectric constant of glass makes it possible to measure the electrical capacitance of the wall of a glass container located against two elongated electrodes of a sensor which contact the bottle as it is rolled along the sensor. This capacitance increases monotonically as the thickness of the glass container increases and can be measured using an electronic circuit to convert the capacitance to a voltage. A voltage representative of the thickness of the wall can be continuously generated as the bottle rolls along the sensor, and if the voltage decreases below a selected value (the value which represents the minimal wall thickness), the bottle being tested can be rejected.

Most devices available suffer from accuracy problems due to measuring the small changes in capacitance caused by changes in wall thickness (typically on the order of $10^{-3}$ Picofarad change in measured capacitance per $10^{-3}$ inch change in wall thickness), and the non-linear change in capacitance as a function of thickness over the range provided by glass containers.

It is an object of the present invention to provide a model for converting a measurement voltage, that is an accurate representation of the bottle's wall thickness, to a thickness dimension.

Other objects and advantages of the present invention will become apparent from the following portion of the specification and from the following drawings which illustrate in accordance with the mandate of the patent statutes a presently preferred embodiment incorporating the principles of the invention.

REFERRING TO THE DRAWINGS

Figure 2:
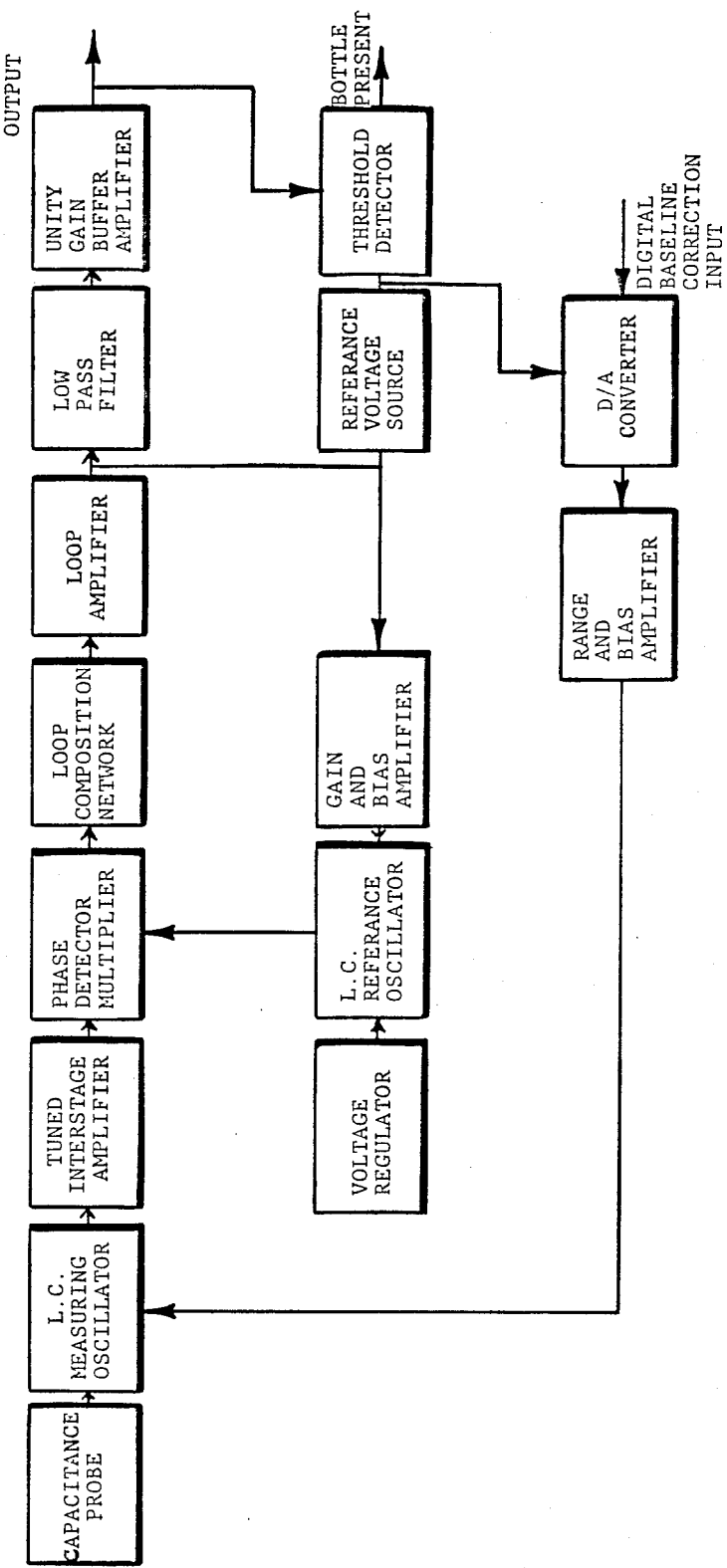

FIG. 1 is an oblique view of a portion of a test station of a glass container inspecting machine; and FIG. 2 is an electronic schematic diagram for the test station illustrated in FIG. 1.

The glass container inspection machine has a station for testing a round bottle 10 which is supported by a support plate 12 and which is advanced along the support plate 12 by a bottle carrier 14. During its displacement past the test station, the carrier 14 forces the bottle against a number (three) of parallel, horizontally extending and vertically spaced capacitance sensing strips 16 which are secured to resilient foam strips 18 mounted on suitable brackets 20. The brackets are connected by posts 22 to corresponding housings 24 for oscillator assemblies which receive a capacitance signal via calibrated cables 26 and generate voltage signals which are supplied to the computer 30.

Glass thickness measurements are made using the probe and cable assembly which has a capacitance of about 50 pf without glass being sensed. The sensitivity of the probe to glass is about 0.002 pf of capacitance for each $10^{-3}$ of glass and decreases as glass thickness increases.

A capacitance tuned Measuring Oscillator (a transformer coupled LC oscillator) is formed by placing the probe in parallel with a ferrite pot core inductor which has an extra winding for feedback. This measuring oscillator is tuned by the capacitance of the probe and accordingly converts small changes in capacitance (a change in bottle thickness) to small changes in frequency. This output frequency is passed to a Tuned Interstage Amplifier which rejects signals that are outside the frequency range of interest. A capacitance tuned Reference Oscillator which is identical to the Measuring Oscillator is formed using an identical inductor and a stable capacitor that equals the no glass capacitance of the probe and cable assembly.

To each oscillator is added some additional capacitance in the form of a varactor (a capacitor in series with a reversed biased tuning diode). The network values are chosen so that the diode can be biased by means of a biasing resistor over a range of voltages (from $-3$ to $-10$ volts). The value of the capacitance change due to the network and varactor is chosen to be approximately equal to the change in capacitance for the largest glass thickness expected.

In the preferred embodiment, the varactor bias of the Measuring Oscillator is set as a starting point approximately to the mid-point of its range and the bias of the varactor in the Reference Oscillator is set to its maximum point ($-10$ volts in the above example).

A Phase Locked Loop is formed to adjust the voltage to exactly match the capacitance of the probe and glass to the reference capacitance (the varactor) of the Reference Oscillator by coupling the two oscillator outputs with a Phase Detector Multiplier. The detected phase is fed to a Loop Compensation Network (a band width shaping filter) and Amplifier. Due to the gain of the Amplifier, a small error in phase will result in a substantial output voltage. The Loop is closed through a Gain and Bias Amplifier which is set as follows: When the amplifier output is at the desired minimum (0 volts in the illustrated case), the varactor is set to minimum capacitance ($-10$ volts to the varactor). The gain is set so that the desired maximum out of the amplifier (5 volts) sets the varactor to the maximum capacitance ($-3$ volts to the varactor).

The Phase Locked Loop is closed to force the Measuring Oscillator and the Reference Oscillator to operate at exactly the same frequencies. When no glass is sensed by the probe, the frequencies are equal when the Reference Oscillator varactor is at minimum, so that the output of the Loop Amplifier is zero. As glass is added to the probe, the output of the Loop Amplifier causes the varactor in the Reference Oscillator to change capacitance an amount exactly equal to the change in the Measuring Oscillator capacitance due to the glass wall thickness. The capacitance versus voltage characteristics of the varactor are known, and accordingly, this data can be inverted to form a voltage versus capacitance chart. Varactor capacitance varies slowly as a function of applied voltage. This chart is further shifted to a more convenient voltage scale by the action of the Gain and Bias Amplifier.

The varactor voltage versus capacitance curve is non-linear. A shift in the bias point of the varactor would cause an undesirable shift in scale factor within this scheme. Accordingly, when changes occur that shift the no glass value from the desired set point, a change in voltage is made to the varactor in the Measuring Oscillator. Since the predominant changes that occur are due to temperature, the control input can be referred to as the temperature compensating input. This preserves the scale of the phase locked output.

The glass thickness signal is obtained by passing the output of the Phase Locked Loop through a limiting Low Pass Filter and a Unity Gain Buffer Amplifier. From there, it goes to an A/D Converter to be coupled with the control apparatus as desired.

Samples that correspond to no glass are processed through a feedback algorithm that makes adjustments to a D/A converter. This keeps the base frequency of both Oscillators at the same frequency, i.e., when no glass is present, the frequency will remain fixed at a selected value even with temperature changes and stray capacitance.

The Measuring Oscillator is applied as the input to a phase lock Loop where the Reference Oscillator is used as the voltage controlled oscillator (VCO) because the phase locked loop tunes the VCO allowing no steady state frequency error between it and the input frequency, the capacitance of the reference capacitance must precisely match the capacitance of the probe/bottle combination. The voltage across the reference provides a good representation of the bottle's wall thickness, limited in practice only by the match between the Measuring and Reference Oscillators and by the temperature drift coefficient and sensitivity of the varactor.

Since there is a non-linear change in capacitance as a function of thickness over the range provided by glass containers, a linearizer must be provided.

The linearizer uses basic non-linear regression techniques combined with a "good sense" model of the capacitance-wall thickness relationship. While regression techniques are well known, it is also well known that their success depends on a correct choice of model. If the model does not represent the data with sufficient accuracy, the results of the regression will not be accurate. Also, it is very difficult to postulate a "good" model. The relationship between the probe capacitance and the wall thickness of the container is very non-linear. This situation can not be improved by better probe design because the required circumferential resolution of the measurement is of the same order of magnitude as the wall thickness. Thus, the electric fields in the container must fall-off substantially over the range of container wall thicknesses, creating a proportionately non-linear capacitance function. The relationship between wall thickness and capacitance can not be obtained analytically as it is a three-dimensional solution of Maxwell's equations for highly non-idealized geometries. Computer numerical solutions are possible, and while these provide insight into probe design, they are too cumbersome and time consuming to use in a wall thickness instrument to determine the thickness value corresponding to a measured capacitance. However, combining the facts that:

The relationship between thickness and capacitance must be linear for small thickness. As the thickness increases, the capacitance will approach some "infinite thickness" value. Assuming that the "cross-over" point between these two solutions occurs at a thickness value on the order of half the probe spacing, a model can be proposed which has been shown empirically to represent wall thickness data very well. This model is as follows:

$$C(T) = A \times T/(1 + B \times T)$$

where: C is the measured capacitance, T is the wall thickness, A is the coefficient describing the small thickness, linear relationship and B is the coefficient describing the large thickness, non-linear relationship. The "infinite thickness" capacitance is A/B and cross-over wall thickness is 1/B. This model is also easy to employ in a wall thickness device because "pseudo" linear regression techniques can be used to calculate A and B from two or more known pairs (for example determined experimentally) of C and T.

I claim:

1. A machine for inspecting the wall thickness of a glass container comprising:

capacitance sensing means for providing an output signal representative of the sensed capacitance;

means for presenting a portion of the wall of a glass container to said capacitance sensing means; and means responsive to said output signal for empirically converting the sensed capacitance to data representing the wall thickness using the following model:

$$C(T) = A \times T/(1 + B \times T)$$

where C is the measured capacitance, T is the wall thickness, A is the coefficient describing the small thickness, linear relationship, and B is the coefficient describing the large thickness, non-linear relationship.

* * * * *